(12) United States Patent
Miyano et al.

(10) Patent No.: US 8,938,207 B2
(45) Date of Patent: Jan. 20, 2015

(54) RADIO FREQUENCY RECEIVER AND RADIO RECEIVER

(75) Inventors: Kentaro Miyano, Osaka (JP); Ippei Kanno, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 400 days.

(21) Appl. No.: 13/419,974

(22) Filed: Mar. 14, 2012

(65) Prior Publication Data

US 2012/0171979 A1 Jul. 5, 2012

Related U.S. Application Data

(63) Continuation of application No. PCT/JP2011/004302, filed on Jul. 28, 2011.

(30) Foreign Application Priority Data

Aug. 3, 2010 (JP) ................................. 2010-174382

(51) Int. Cl.
*H04B 1/06* (2006.01)
*H03G 3/30* (2006.01)
(Continued)

(52) U.S. Cl.
CPC ........... *H03G 3/3068* (2013.01); *H03F 1/3247* (2013.01); *H03F 3/189* (2013.01);
(Continued)

(58) Field of Classification Search
CPC .......... G01S 19/235; H03F 7/04; H03L 7/099; H03L 7/08; H03L 7/085; H03L 7/093; H03L 7/0991; H03L 7/0995; H03D 7/08; H04B 1/3805; H04B 1/1036; H04B 1/109; H04B 10/548; H04B 10/6165; H04B 10/63; H04B 10/64; H04B 15/00; H04B 1/0475; H04B 1/10; H04B 1/1027; H04J 11/004; H04L 1/0631; H04L 2027/0067; H04L 7/0331;
H04L 25/03; H04L 7/0004; H04L 7/0079; G01R 29/26; H03B 19/00; H03B 28/00; H03F 2200/294; H03F 3/189
USPC ................................................... 455/130–355
See application file for complete search history.

(56) References Cited

U.S. PATENT DOCUMENTS 3,993,958 A * 11/1976 Cutsogeorge ................... 331/25
5,376,974 A * 12/1994 Suzuki et al. ................. 348/735
(Continued)

FOREIGN PATENT DOCUMENTS

| CN | 101582692 A * 11/2009 |
| JP | 9-289467    11/1997 |

(Continued)

OTHER PUBLICATIONS

International Search Report issued in International Patent Application No. PCT/JP2011/004302 dated Sep. 13, 2011.

*Primary Examiner* — Lana N Le

(74) *Attorney, Agent, or Firm* — McDermott Will & Emery LLP

(57) ABSTRACT

An RF receiver includes a variable gain amplifier which amplifies a received RF signal based on a gain control signal, a peak detector which determines a peak value of the amplified signal, a mixer which downconverts the amplified signal to a downconverted signal, and a control unit which determines whether or not an interfering signal other than an adjacent channel interfering signal is received. If the control unit determines that the interfering signal other than the adjacent channel interfering signal is received, the control unit generates the gain control signal so that the range of the peak value is a first range; otherwise, the control unit generates the gain control signal so that the range of the peak value is a second range. The upper and lower bounds of the second range are lower than the upper and lower bounds of the first range, respectively.

5 Claims, 8 Drawing Sheets

(51) Int. Cl.
*H03F 1/32* (2006.01)
*H03F 3/189* (2006.01)
*H03F 3/195* (2006.01)
*H03F 3/24* (2006.01)

(52) U.S. Cl.
CPC ............... *H03F 3/195* (2013.01); *H03F 3/24* (2013.01); *H03G 3/3052* (2013.01); *H03G 3/3073* (2013.01); *H03G 3/3078* (2013.01); *H03F 2200/171* (2013.01); *H03F 2200/435* (2013.01)
USPC ........................................ 455/232.1; 455/296

(56) References Cited

U.S. PATENT DOCUMENTS

| | | | |
|---|---|---|---|
| 5,471,187 A * | 11/1995 | Hansen et al. | 340/146.2 |
| 6,112,070 A | 8/2000 | Katsuyama et al. | |
| 8,050,643 B1 * | 11/2011 | Wu et al. | 455/234.1 |
| 2009/0143042 A1 * | 6/2009 | Kawai | 455/296 |
| 2009/0163163 A1 | 6/2009 | Itoh | |
| 2009/0310524 A1 * | 12/2009 | Katsube et al. | 370/311 |
| 2010/0151800 A1 * | 6/2010 | Akita et al. | 455/75 |

FOREIGN PATENT DOCUMENTS

| | | |
|---|---|---|
| JP | 2007-174101 | 7/2007 |
| JP | 2008-271403 A | 11/2008 |
| JP | 2009-027329 | 2/2009 |
| JP | 2009-147616 | 7/2009 |
| JP | 2010-147622 | 7/2010 |
| WO | WO 2009/011143 A1 | 1/2009 |

* cited by examiner

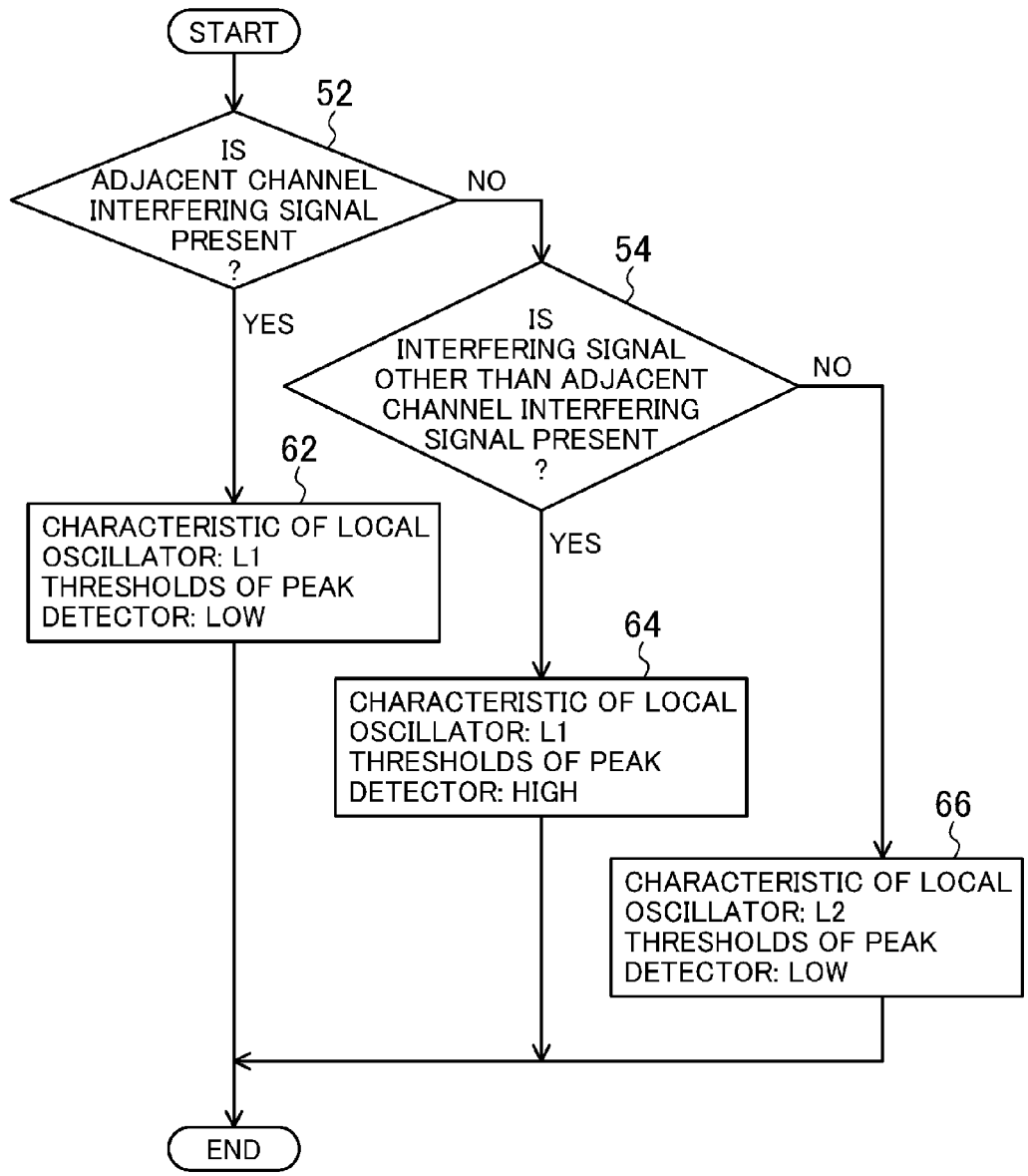

RADIO FREQUENCY RECEIVER AND RADIO RECEIVER

CROSS-REFERENCE TO RELATED APPLICATIONS

This is a continuation of PCT International Application PCT/JP2011/004302 filed on Jul. 28, 2011, which claims priority to Japanese Patent Application No. 2010-174382 filed on Aug. 3, 2010. The disclosures of these applications including the specifications, the drawings, and the claims are hereby incorporated by reference in its entirety.

BACKGROUND

The present disclosure relates to radio frequency (RF) receivers for processing RF signals.

A receiver for digital terrestrial television broadcasting etc. uses an RF receiver for receiving an RF signal. By way of example, Japanese Patent Publication No. H09-289467 (Patent Document 1) describes an RF receiver circuit (FIG. 1 of Patent Document 1). The circuit of Patent Document 1 multiplies, in a mixer, a signal received through a band-pass filter by a signal generated in a voltage-controlled oscillator (VCO). A signal which controls the oscillation frequency of the VCO is also provided to the band-pass filter, and the band-pass filter changes the passband for the received signal based on this control signal. This configuration can attenuate interfering signals depending on the frequency of the received signal.

SUMMARY

However, the circuit of Patent Document 1 needs to change the passband of the band-pass filter. To improve interference immunity, a need also exists to use a band-pass filter in which the amount of attenuation rapidly changes depending on the frequency. Arranging a band-pass filter so as to have a changeable passband, or so as to allow the amount of attenuation to rapidly change depending on the frequency presents a problem in that the circuit size of the filter increases.

It is an object of the present disclosure to improve interference immunity without changing the characteristics of the filter through which the received signal passes.

A radio frequency (RF) receiver according to the present disclosure includes a variable gain amplifier configured to amplify a received RF signal based on a gain control signal, and to output an amplified signal, a peak detector configured to determine a peak value of the amplified signal, a mixer configured to downconvert the amplified signal to a downconverted signal, and a control unit configured to determine, from the downconverted signal, whether or not an interfering signal other than an adjacent channel interfering signal is received. If the control unit determines that the interfering signal other than the adjacent channel interfering signal is received, the control unit generates the gain control signal which specifies a gain so that a range of the peak value is a first range. If the control unit determines that no interfering signals other than the adjacent channel interfering signal are received, the control unit generates the gain control signal which specifies the gain so that the range of the peak value is a second range. An upper bound of the second range is lower than an upper bound of the first range, and a lower bound of the second range is lower than a lower bound of the first range.

Another radio frequency (RF) receiver according to the present disclosure includes a local oscillator configured to generate a local oscillator signal, a mixer configured to multiply a received RF signal by the local oscillator signal, thereby to downconvert the received RF signal to a downconverted signal, and a control unit configured to determine whether an interfering signal is received or not, from the downconverted signal. The control unit changes a phase noise characteristic of the local oscillator based on a determination result of whether an interfering signal is received or not.

A radio receiver according to the present disclosure includes one of the RF receivers, and a demodulator unit configured to demodulate the downconverted signal.

According to the present disclosure, settings are changed in a component other than the filter through which the received signal passes. Accordingly, interference immunity can be improved without changing the characteristics of the filter through which the received signal passes.

BRIEF DESCRIPTION OF THE DRAWINGS

FIG. 12 is a flowchart illustrating an example control flow in the control unit of FIG. 10.

DETAILED DESCRIPTION

Figure 1:
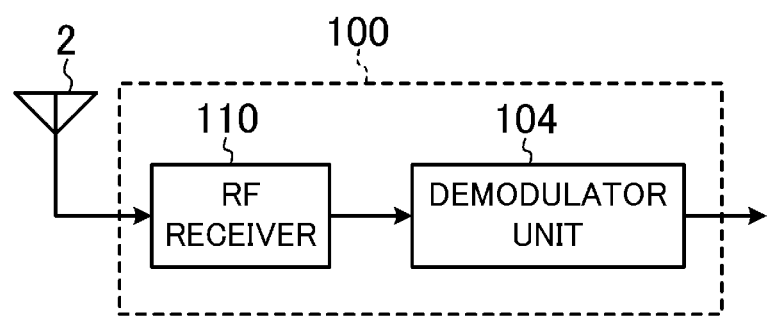
FIG. 1 is a block diagram illustrating an example configuration of a radio receiver according to the present invention.

An example embodiment of the present invention will be described below with reference to the drawings, in which reference numerals having the same last two digits indicate the same or similar components corresponding to one another.

FIG. 1 is a block diagram illustrating an example configuration of a radio receiver according to an example embodiment of the present invention. The radio receiver 100 of FIG. 1 includes an RF receiver 110 and a demodulator unit 104.

Figure 2:
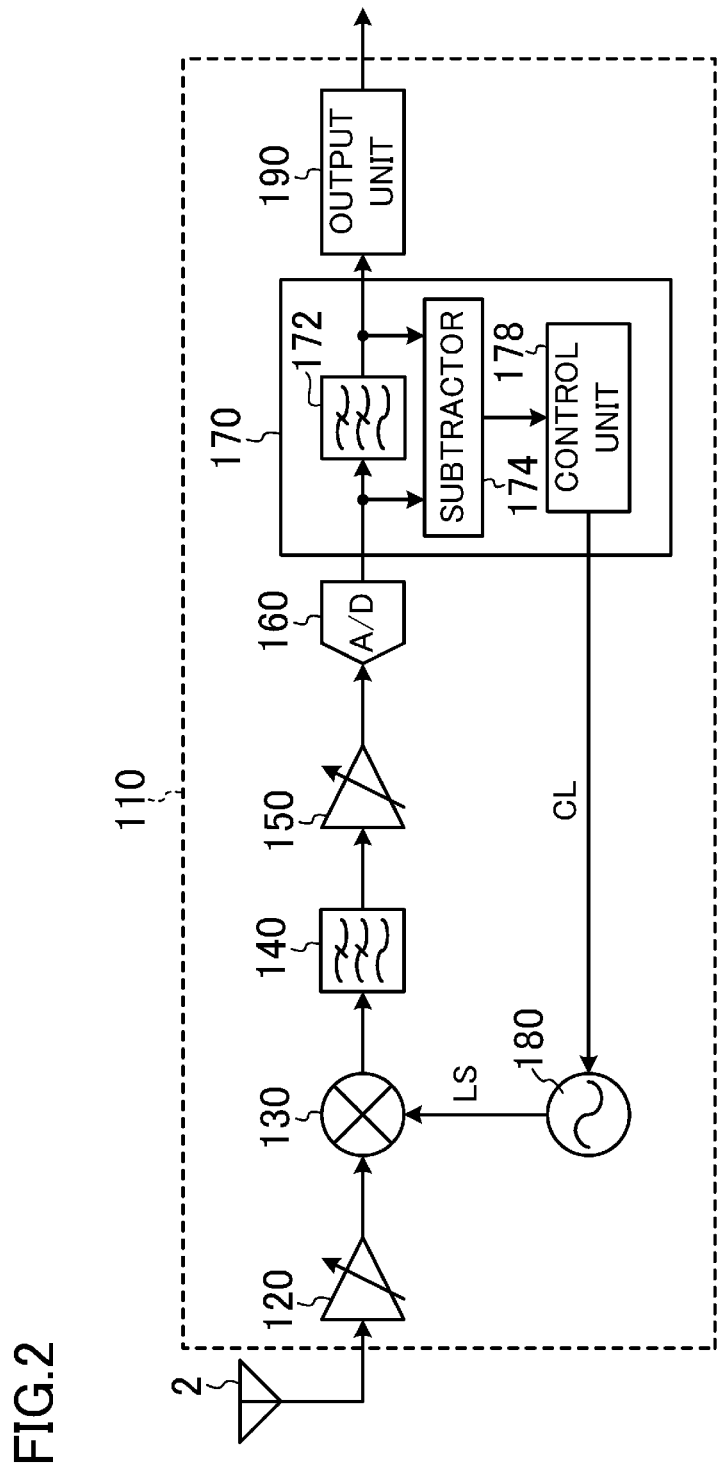
FIG. 2 is a block diagram illustrating an example configuration of the RF receiver of FIG. 1.

FIG. 2 is a block diagram illustrating an example configuration of the RF receiver 110 of FIG. 1. The RF receiver 110 includes variable gain amplifiers (VGAs) 120 and 150, a mixer 130, an analog filter 140, an analog-to-digital converter (ADC) 160, a signal processor 170, a local oscillator 180, and an output unit 190.

An antenna 2 receives, for example, an RF signal of digital terrestrial television broadcasting. The received signal may be a signal of other wireless communication schemes or of other broadcasting schemes. The VGA 120 amplifies the RF signal received by the antenna 2, and outputs the amplified signal. The mixer 130 multiplies the RF signal amplified by the VGA 120 by a local oscillator signal LS generated by the local oscillator 180, thereby downconverts the amplified RF signal to a downconverted signal such as an intermediate frequency (IF) signal or a baseband signal.

The analog filter 140 is a low-pass filter. The analog filter 140 smoothes the IF or the baseband signal after the frequency conversion in the mixer 130—in other words, attenuates high frequency components of the signal—and outputs the smoothed signal. The VGA 150 amplifies the output signal of the analog filter 140, and outputs the amplified signal. The ADC 160 converts the analog signal amplified by the VGA 150 into a digital signal, and outputs the digital signal.

The signal processor 170 includes a digital filter 172, a subtractor 174, and a control unit 178. The digital filter 172 is a low-pass filter. The digital filter 172 smoothes the digital signal output from the ADC 160—in other words, attenuates high frequency components of the signal—and outputs the smoothed signal. The subtractor 174 determines the difference between the power of the input signal of the digital filter 172 and the power of the output signal of the digital filter 172, and outputs the difference. The control unit 178 determines whether an interfering signal is present or not from the difference determined in the subtractor 174, and outputs an oscillator control signal (parameter) CL based on the determination result. The local oscillator 180 generates the local oscillator signal LS based on the oscillator control signal CL output from the control unit 178, and outputs the local oscillator signal LS to the mixer 130.

The output unit 190 includes, for example, a digital-to-analog converter (DAC) unit or a digital output interface. The DAC unit converts the digital signal output from the digital filter 172 into an analog signal, and outputs the analog signal. If the demodulator unit 104 includes an analog input unit, the output of the DAC unit is input to the demodulator unit 104. The digital output interface outputs the digital signal output from the digital filter 172, for example, as a digital signal compliant to a low voltage differential signaling (LVDS) standard. If the demodulator unit 104 includes a digital input unit, the output of the digital output interface is input to the demodulator unit 104. The signal processor 170 may have a demodulation function, in which case the output unit 190 outputs a demodulated signal.

The demodulator unit 104 of FIG. 1 demodulates the signal output from the output unit 190, and outputs the demodulated signal. If the RF receiver 110 supports more than one wireless communication scheme and/or more than one broadcasting scheme, the demodulator unit 104 includes more than one demodulator. Thus, the radio receiver 100 supports more than one wireless communication scheme and/or more than one broadcasting scheme.

Figure 3:
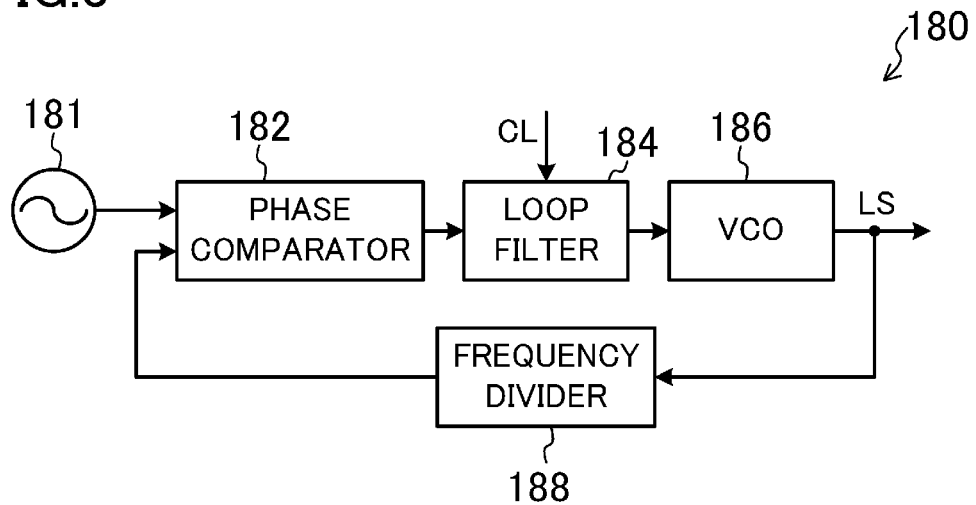
FIG. 3 is a block diagram illustrating an example configuration of the local oscillator of FIG. 2.

FIG. 3 is a block diagram illustrating an example configuration of the local oscillator 180 of FIG. 2. The local oscillator 180 includes a reference signal generator 181, a phase comparator 182, a loop filter 184, a voltage controlled oscillator (VCO) 186, and a frequency divider 188.

The reference signal generator 181 generates and outputs an oscillator signal having a predetermined constant frequency. The reference signal generator 181 is, for example, a quartz oscillator. The phase comparator 182 converts, into a voltage, the phase difference between the oscillator signal from the reference signal generator 181 and the output signal of the frequency divider 188, and outputs the voltage. The loop filter 184 is a low-pass filter. The loop filter 184 smoothes the output signal of the phase comparator 182, and outputs the smoothed signal. The loop filter 184 changes the characteristics thereof based on the oscillator control signal CL. The VCO 186 generates and outputs the local oscillator signal LS having a frequency dependent on the output voltage of the loop filter 184. The frequency divider 188 divides the frequency of the local oscillator signal LS, and outputs the frequency-divided signal. Note that the local oscillator 180 may be either an analog or a digital circuit.

Figure 4A:
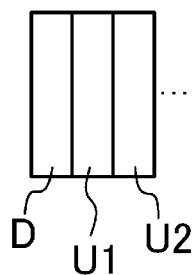
FIG. 4A is a schematic diagram illustrating an example of the components of the signals present in the input signal of the digital filter of FIG. 2.
Figure 4B:
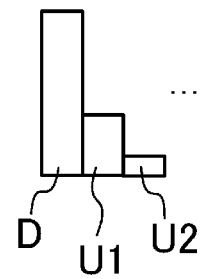
FIG. 4B is a schematic diagram illustrating an example of the components of the signals present in the output signal of the digital filter of FIG. 2.

FIG. 4A is a schematic diagram illustrating an example of the components of the signals present in the input signal of the digital filter 172 of FIG. 2. FIG. 4B is a schematic diagram illustrating an example of the components of the signals present in the output signal of the digital filter 172 of FIG. 2. In the present specification, a signal present in the channel next to, or immediately neighboring, the channel of the desired signal D is referred to as an adjacent channel interfering signal. A channel more removed from the immediately adjacent channel is referred to as an "alternate channel," which is sometimes referred to as a next adjacent channel or a next-to-nearest channel. A signal present in such an alternate channel is referred to as an alternate channel interfering signal. FIGS. 4A and 4B illustrate the levels of the desired signal D, of the adjacent channel interfering signal U1, and of the alternate channel interfering signal U2.

The digital filter 172 outputs the desired signal D without significant attenuation, and outputs interfering signals, such as the adjacent channel interfering signal U1 and the alternate channel interfering signal U2, after providing attenuation. Accordingly, the components of the signals present in the output signal of the digital filter 172 are as shown in FIG. 4B. The subtractor 174 subtracts the power of the output signal of the digital filter 172 from the power of the input signal of the digital filter 172, and outputs the difference calculated.

The control unit 178 determines that an interfering signal is present if the difference calculated by the subtractor 174 is greater than a predetermined threshold for detecting an interfering signal. More specifically, if the RF receiver 110 receives the desired signal D, and receives no interfering signals, then the powers of the input signal and of the output signal of the digital filter 172 are nearly the same, and therefore the calculated difference is less than the predetermined threshold. In such a case, the control unit 178 determines that no interfering signals are received by the RF receiver 110. Meanwhile, if the RF receiver 110 receives an interfering signal, the power of the output signal of the digital filter 172 is reduced by the amount of attenuation of the interfering signal with respect to the power of the input signal. Accordingly, if the difference calculated by the subtractor 174 is greater than or equal to the predetermined threshold, the control unit 178 determines that an interfering signal is received by the RF receiver 110.

Figure 5:
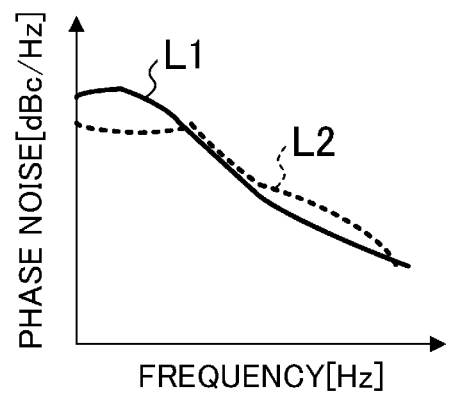
FIG. 5 is a graph illustrating an example of the phase noise characteristic of the local oscillator of FIG. 2.

FIG. 5 is a graph illustrating an example of the phase noise characteristic of the local oscillator 180 of FIG. 2. The characteristic of the local oscillator 180 can be switched, for example, between a characteristic L1 and a characteristic L2 of FIG. 5 by changing a characteristic of the loop filter 184 (e.g., a component value of a part included in the loop filter 184, or filter coefficients of the loop filter 184), the output impedance of the phase comparator 182, etc., by the control unit 178. The characteristic L1 has low phase noise in higher frequencies, while the characteristic L2 has low phase noise in a low frequency band near 0 Hz.

If the control unit 178 determines that no interfering signals are received, the control unit 178 outputs an oscillator control signal CL which instructs the local oscillator 180 to have the characteristic L2. The loop filter 184 changes the characteristic thereof based on the oscillator control signal CL so that the local oscillator 180 will have the characteristic L2. This operation reduces the phase noise in a low frequency band near 0 Hz.

If the control unit 178 determines that an interfering signal is received, the control unit 178 outputs an oscillator control signal CL which instructs the local oscillator 180 to have the characteristic L1. The loop filter 184 changes the characteristic thereof based on the oscillator control signal CL so that the local oscillator 180 will have the characteristic L1. This operation allows the interfering signals to be less susceptible to phase noise, thereby improving interference immunity.

Thus, the RF receiver 110 of FIG. 2 optimizes the phase noise characteristic of the local oscillator depending on whether an interfering signal is present or not, thereby improving the reception performance. Although the foregoing description assumes that whether an interfering signal is present or not is determined based on the powers of the input signal and of the output signal of the digital filter 172, the control unit 178 may determine whether an interfering signal is present or not based on, for example, the powers of the input signal and of the output signal of the analog filter 140, or on other methods.

Figure 6:
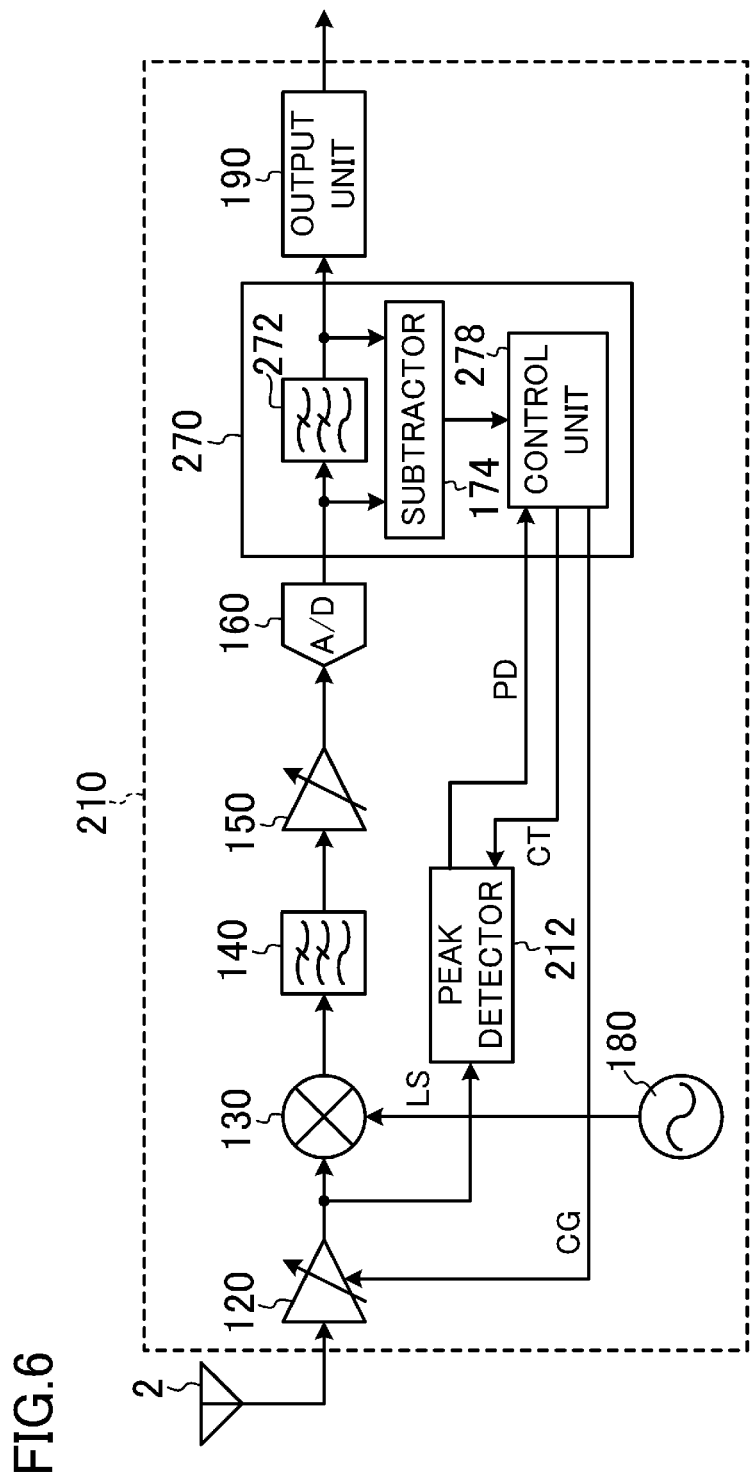
FIG. 6 is a block diagram illustrating a configuration of a variation of the RF receiver of FIG. 2.

FIG. 6 is a block diagram illustrating a configuration of a variation of the RF receiver 110 of FIG. 2. The RF receiver 210 of FIG. 6 includes a signal processor 270 in place of the signal processor 170, and further includes a peak detector 212. The signal processor 270 includes a digital filter 272, a subtractor 174, and a control unit 278. The digital filter 272 is a low-pass filter. The subtractor 174 is similar to that described referring to FIG. 2.

The VGA 120 performs amplification based on a gain control signal CG from the control unit 278, and the local oscillator 180 is not controlled by the control unit 278. The other operations are similar to those of the RF receiver 110 of FIG. 2. The radio receiver 100 of FIG. 1 may employ the RF receiver 210 in place of the RF receiver 110.

The peak detector 212 includes a detector circuit, a comparator, etc., and determines a peak value of the output signal of the VGA 120, for example, in each predetermined period. For example, each time a peak value is determined, the peak detector 212 compares the peak value with two thresholds for controlling the peak value, and outputs the result as a peak detection result PD. The peak detection result PD represents one of the situations: the peak value is greater than the higher threshold; the peak value is less than or equal to the higher threshold, and is higher than the lower threshold; and the peak value is less than or equal to the lower threshold. The peak detector 212 sets these thresholds for controlling the peak value based on a threshold control signal CT.

The control unit 278 generates, based on the peak detection result PD, a gain control signal CG which specifies the gain so that the peak value falls within a predetermined range, and outputs the gain control signal CG to the VGA 120. For example, if the peak value is greater than the higher threshold, the control unit 278 generates a gain control signal CG which specifies a gain which is one level lower. Meanwhile, if the peak value is less than or equal to the lower threshold, the control unit 278 generates a gain control signal CG which specifies a gain which is one level higher. The VGA 120 amplifies a signal with a gain represented by the gain control signal CG. The step size of the gain level of the VGA 120 is a (dB) ("a" is a real number, which is, for example, 1.0).

Figure 7A:
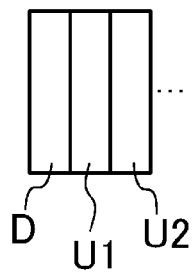
FIG. 7A is a schematic diagram illustrating an example of the components of the signals present in the input signal of the digital filter of FIG. 6.
Figure 7B:
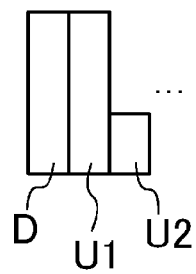
FIG. 7B is a schematic diagram illustrating an example of the components of the signals present in the output signal of the digital filter of FIG. 6.

FIG. 7A is a schematic diagram illustrating an example of the components of the signals present in the input signal of the digital filter 272 of FIG. 6. FIG. 7B is a schematic diagram illustrating an example of the components of the signals present in the output signal of the digital filter 272 of FIG. 6. FIGS. 7A and 7B illustrate the levels of the desired signal D, of the adjacent channel interfering signal U1, and of the alternate channel interfering signal U2.

The digital filter 272 outputs the desired signal D and the adjacent channel interfering signal U1 without significant attenuation, and outputs other interfering signals such as the alternate channel interfering signal U2 after providing attenuation. Accordingly, the components of the signals present in the output signal of the digital filter 272 are as shown in FIG. 7B. The subtractor 174 subtracts the power of the output signal of the digital filter 272 from the power of the input signal of the digital filter 272, and outputs the difference calculated.

The control unit 278 compares the difference calculated by the subtractor 174 with a predetermined threshold for detecting an interfering signal other than the adjacent channel interfering signal, thereby determines whether or not an interfering signal other than the adjacent channel interfering signal U1 is received by the RF receiver 210. More specifically, if the RF receiver 210 receives the desired signal D and the adjacent channel interfering signal U1, and receives no interfering signals other than the adjacent channel interfering signal U1, then the powers of the input signal and of the output signal of the digital filter 272 are nearly the same. Thus, if the difference calculated by the subtractor 174 is less than the predetermined threshold, the control unit 278 determines that no interfering signals other than the adjacent channel interfering signal U1 are received. If the RF receiver 210 receives an interfering signal other than the adjacent channel interfering signal U1 (e.g., the alternate channel interfering signal U2), the power of the output signal of the digital filter 272 is reduced by the amount of attenuation of that interfering signal with respect to the power of the input signal. Accordingly, if the difference calculated by the subtractor 174 is greater than or equal to the predetermined threshold, the control unit 278 determines that an interfering signal other than the adjacent channel interfering signal U1 is received.

If the control unit 278 determines that an interfering signal other than the adjacent channel interfering signal U1 is received, the control unit 278 generates a gain control signal CG which specifies the gain so that a range of the peak value determined by the peak detector 212 is a first range, while if the control unit 278 determines that no interfering signals other than the adjacent channel interfering signal U1 are received, the control unit 278 generates a gain control signal CG which specifies the gain so that the range of the peak value determined by the peak detector 212 is a second range. Here, the upper bound of the second range is lower than the upper bound of the first range, and the lower bound of the second range is lower than the lower bound of the first range.

More specifically, if the control unit 278 determines that an interfering signal other than the adjacent channel interfering signal U1 is received, the control unit 278 generates a threshold control signal CT representing the upper and the lower bounds of the first range. The peak detector 212 uses the values (higher thresholds) represented in the threshold control signal CT as the thresholds for controlling the peak value.

Accordingly, the control unit 278 generates the gain control signal CG so that the range of the peak value will be the first range.

If the control unit 278 determines that no interfering signals other than the adjacent channel interfering signal U1 are received, the control unit 278 generates a threshold control signal CT representing the upper and the lower bounds of the second range. The peak detector 212 uses the values (lower thresholds) represented in the threshold control signal CT as the thresholds for controlling the peak value. Accordingly, the control unit 278 generates the gain control signal CG so that the range of the peak value will be the second range.

Figure 8:
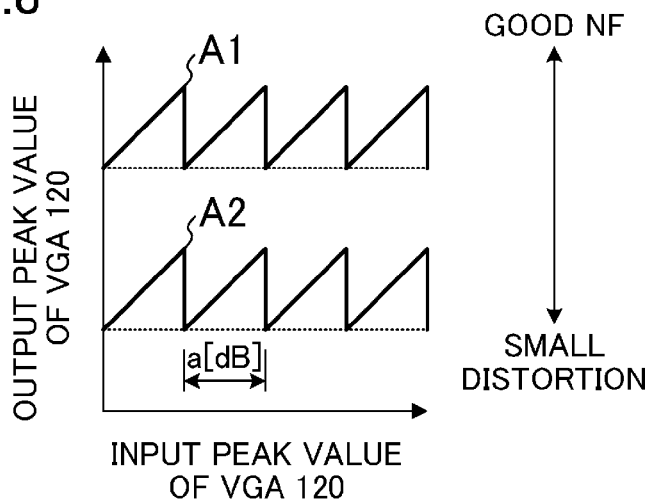
FIG. 8 is a graph illustrating an example of the relationship between the input peak value and the output peak value of the VGA of FIG. 6.

FIG. 8 is a graph illustrating an example of the relationship between the input peak value and the output peak value of the VGA 120 of FIG. 6. If it is determined that an interfering signal other than the adjacent channel interfering signal U1 is received, the range of the output peak value of the VGA 120 is set to the first range (characteristic A1 of FIG. 8). If it is determined that no interfering signals other than the adjacent channel interfering signal U1 are received, the range of the output peak value of the VGA 120 is set to the second range (characteristic A2 of FIG. 8).

As shown in FIG. 8, each increase by, for example, a (dB) of the input peak value of the VGA 120 causes the gain of the VGA 120 to be decreased by a (dB). Such a characteristic controls the level of the output peak value of the VGA 120 so as to maintain a nearly constant level. Maintaining the output peak value at a high level such as the characteristic A1 of FIG. 8 improves (reduces) the noise figure (NF) of the VGA 120. Maintaining the output peak value at a low level such as the characteristic A2 of FIG. 8 reduces the distortion in the VGA 120.

As described above, if higher thresholds are used in the peak detector 212, the characteristic of the VGA 120 becomes one such as the characteristic A1, and the NF of the VGA 120 improves. If lower thresholds are used in the peak detector 212, the characteristic of the VGA 120 becomes one such as the characteristic A2, and the distortion in the VGA 120 is reduced.

Figure 9:
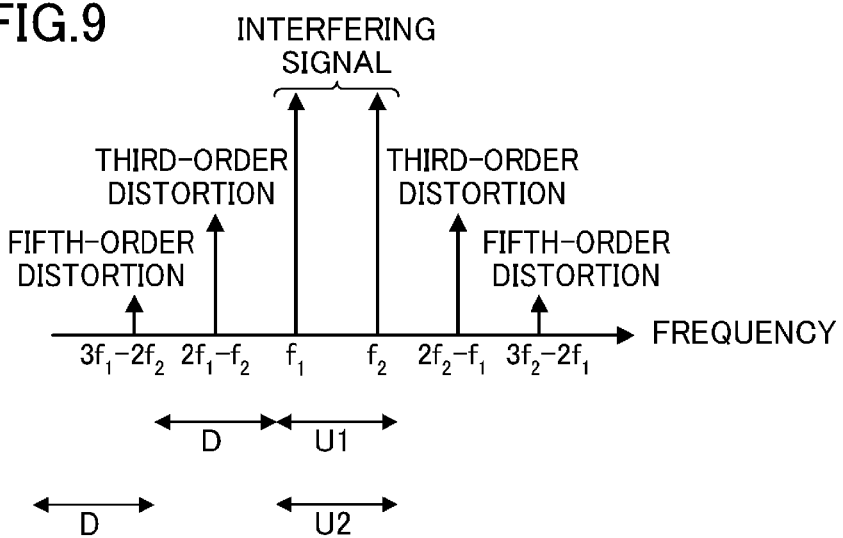
FIG. 9 is a graph illustrating the levels of possible distortions and the frequencies thereof.

FIG. 9 is a graph illustrating the levels of possible distortions and the frequencies thereof. In FIG. 9, the frequency bands of the desired signal channel, of the adjacent channel, and of the alternate channel are respectively designated by D, U1, and U2. If alternate channel interfering signals (an interfering signal having a frequency $f_1$ and an interfering signal having a frequency $f_2$, where $f_1 < f_2$) are present in the adjacent channel (U1), then a third-order distortion (frequency: $2 \cdot f_1 - f_2$) occurs in the desired signal channel (D). If alternate channel interfering signals (an interfering signal having a frequency $f_1$ and an interfering signal having a frequency $f_2$, where $f_1 < f_2$) are present in the alternate channel (U2), then a fifth-order distortion (frequency: $3 \cdot f_1 - 2 \cdot f_2$) occurs in the desired signal channel (D).

In general, if an interfering signal having a frequency $f_1$ and an interfering signal having a frequency $f_2$ are present in an n-th (n is a natural number) channel counted from the desired signal channel (e.g., n=1 for the adjacent channel), a (2n+1)th-order distortion (frequency: $(n+1) \cdot f_1 - n \cdot f_2$) occurs in the desired signal channel. Although not shown in FIG. 9, similar distortions also occur in the desired signal channel when n>2.

Among the distortions which occur in the desired signal band, the levels of third-order distortions are the highest, and the levels of fifth- and higher-order distortions are lower. Thus, fifth- or higher-order distortions have only small effects on the desired signal. Accordingly, the control unit 278 may generate a threshold control signal CT specifying the lower thresholds in a condition where a third-order distortion occurs, and a threshold control signal CT specifying the higher thresholds in a condition where a fifth- or higher-order distortion occurs. Such an operation can reduce the effects of distortions which occur in the desired signal band.

If the RF receiver 210 supports more than one wireless communication scheme or more than one broadcast scheme, the control unit 278 may generate a threshold control signal CT and select either the first or the second range depending on the wireless communication scheme or the broadcast scheme applied to the received RF signal. If a television broadcast is received, desired distortion and a desired NF vary depending on whether the television broadcast is analog or digital. Accordingly, the control unit 278 generates a threshold control signal CT specifying the lower thresholds when an analog television broadcast is received, and generates a threshold control signal CT specifying the higher thresholds when a digital television broadcast is received. Such an operation can reduce the distortions when an analog television broadcast is received, and can reduce the NF when a digital television broadcast is received.

Thus, the RF receiver 210 of FIG. 6 optimizes the thresholds used in the peak detector 212 and the characteristic of the VGA 120 depending on whether or not an interfering signal other than the adjacent channel interfering signal is present, thereby improving the reception performance.

Although the foregoing description assumes that whether or not an interfering signal other than the adjacent channel interfering signal is present is determined based on the powers of the input signal and of the output signal of the digital filter 272, the control unit 278 may determine whether or not an interfering signal other than the adjacent channel interfering signal is present based on the powers of the input signal and of the output signal of the analog filter 140, or on other methods.

Figure 10:
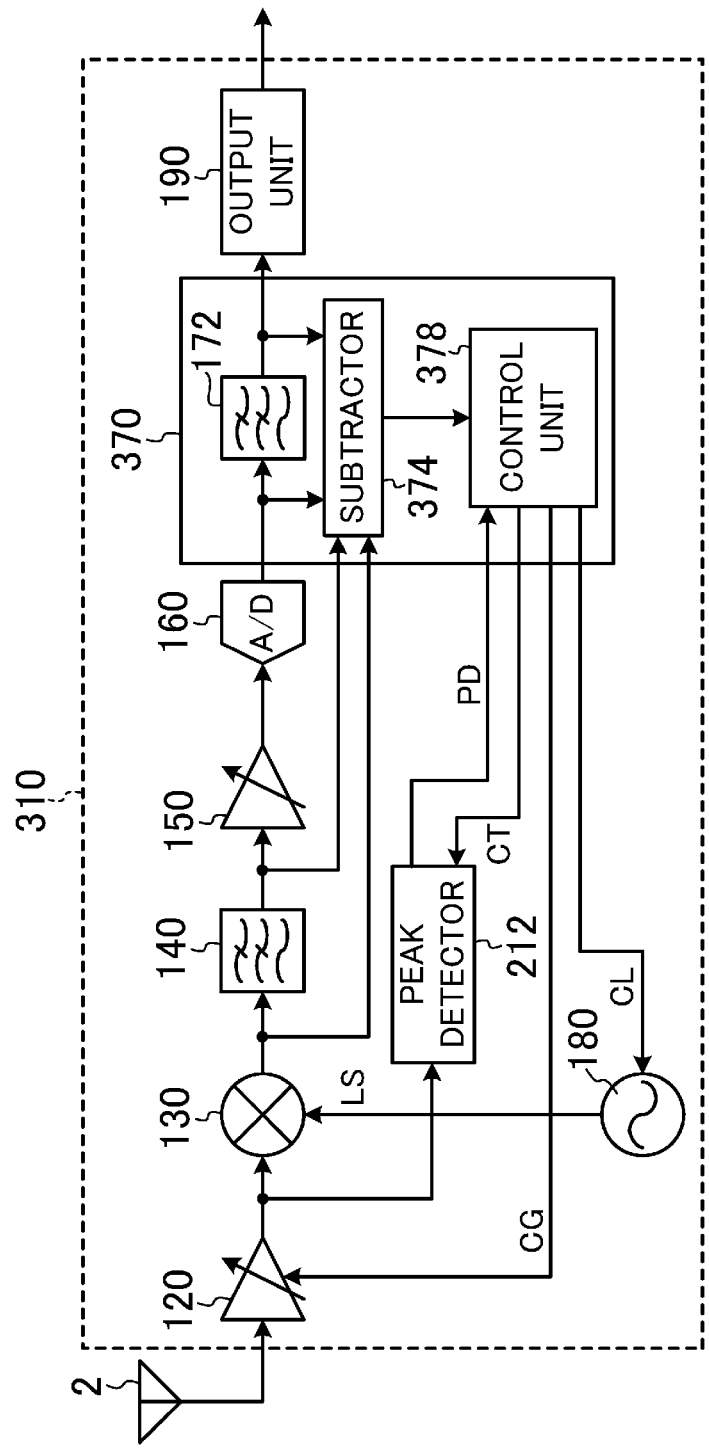
FIG. 10 is a block diagram illustrating a configuration of another variation of the RF receiver of FIG. 2.

FIG. 10 is a block diagram illustrating a configuration of another variation of the RF receiver 110 of FIG. 2. The RF receiver 310 of FIG. 10 includes a signal processor 370 in place of the signal processor 170, and further includes a peak detector 212. The signal processor 370 includes a digital filter 172, a subtractor 374, and a control unit 378. The digital filter 172 is similar to that described referring to FIG. 2.

The gain of the VGA 120 is controlled by the control unit 378. The other operations are similar to those of the RF receiver 110 of FIG. 2. The peak detector 212 is similar to that described referring to FIG. 6. The radio receiver 100 of FIG. 1 may employ the RF receiver 310 in place of the RF receiver 110.

Figure 11A:
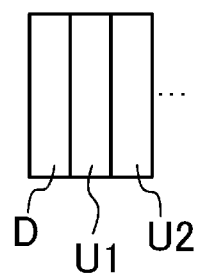
FIG. 11A is a schematic diagram illustrating an example of the components of the signals present in the input signal of the analog filter of FIG. 10.
Figure 11B:
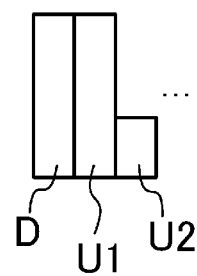
FIG. 11B is a schematic diagram illustrating an example of the components of the signals present in the output signal of the analog filter of FIG. 10.
Figure 11C:
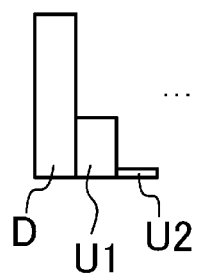
FIG. 11C is a schematic diagram illustrating an example of the components of the signals present in the output signal of the digital filter of FIG. 10.

FIG. 11A is a schematic diagram illustrating an example of the components of the signals present in the input signal of the analog filter 140 of FIG. 10. FIG. 11B is a schematic diagram illustrating an example of the components of the signals present in the output signal of the analog filter 140 of FIG. 10. FIG. 11C is a schematic diagram illustrating an example of the components of the signals present in the output signal of the digital filter 172 of FIG. 10. FIGS. 11A-11C illustrate the levels of the desired signal D, of the adjacent channel interfering signal U1, and of the alternate channel interfering signal U2.

The analog filter 140 outputs the desired signal D and the adjacent channel interfering signal U1 without significant attenuation, and outputs other interfering signals such as the alternate channel interfering signal U2 after providing attenuation. Accordingly, the components of the signals present in the output signal of the analog filter 140 are as shown in FIG. 11B. The subtractor 374 subtracts the power of the output signal of the analog filter 140 from the power of the input signal of the analog filter 140, and outputs the difference calculated.

The digital filter 172 outputs the desired signal D without significant attenuation, and outputs interfering signals such as the adjacent channel interfering signal U1 and the alternate channel interfering signal U2 after providing attenuation. Accordingly, the components of the signals present in the output signal of the digital filter 172 are as shown in FIG. 11C. The subtractor 374 subtracts the power of the output signal of the digital filter 172 from the power of the input signal of the digital filter 172, and outputs the difference calculated.

Since the interfering signals other than the adjacent channel interfering signal U1 have been attenuated in the analog filter 140, the difference between the powers of the input signal and of the output signal of the digital filter 172 is accounted for mainly by the adjacent channel interfering signal U1. Thus, the control unit 378 determines whether the adjacent channel interfering signal U1 is present or not by determining whether or not the difference, output from the subtractor 374, between the powers of the input signal and of the output signal of the digital filter 172 exceeds a predetermined threshold for detecting an interfering signal.

FIG. 12 is a flowchart illustrating an example control flow in the control unit 378 of FIG. 10. At block 52, as described above, the control unit 378 determines whether or not the adjacent channel interfering signal U1 is received (whether or not the adjacent channel interfering signal U1 is present). If it is determined that the adjacent channel interfering signal U1 is received, the process proceeds to block 62. Otherwise, the process proceeds to block 54.

At block 54, the control unit 378 determines whether or not an interfering signal other than the adjacent channel interfering signal U1 is received (whether or not an interfering signal other than the adjacent channel interfering signal U1 is present). The control unit 378 determines whether or not an interfering signal other than the adjacent channel interfering signal U1 is received by determining whether or not the difference, output from the subtractor 374, between the powers of the input signal and of the output signal of the analog filter 140 exceeds a predetermined threshold for detecting an interfering signal other than the adjacent channel interfering signal. If it is determined that such a signal is received, the process proceeds to block 64. Otherwise, the process proceeds to block 66.

At block 62, the control unit 378 generates an oscillator control signal CL which instructs the local oscillator 180 to have the characteristic L1, and a threshold control signal CT which specifies the lower thresholds. In this case, interference immunity is improved, and distortions are reduced. At block 64, the control unit 378 generates an oscillator control signal CL which instructs the local oscillator 180 to have the characteristic L1, and a threshold control signal CT which specifies the higher thresholds. In this case, interference immunity is improved, and the NF is reduced. At block 66, the control unit 378 generates an oscillator control signal CL which instructs the local oscillator 180 to have the characteristic L2, and a threshold control signal CT which specifies the lower thresholds. In this case, reception performance on the desired signal is improved, and distortions are reduced.

Thus, the RF receiver 310 of FIG. 10 optimizes the phase noise characteristic of the local oscillator 180, the thresholds used in the peak detector 212, and the characteristic of the VGA 120 depending on whether or not the adjacent channel interfering signal is received, and on whether or not an interfering signal other than the adjacent channel interfering signal is received, thereby improving the reception performance.

Whether or not the adjacent channel interfering signal is received, and whether or not an interfering signal other than the adjacent channel interfering signal is received may be determined using other methods.

Each function block described herein can typically be implemented in hardware. For example, each function block can be formed on a semiconductor substrate as a part of an integrated circuit (IC). As used herein, the term IC includes large-scale integrated circuit (LSI), application-specific integrated circuit (ASIC), gate array, field programmable gate array (FPGA), etc. Alternatively, a part or all of each function block can be implemented in software. For example, such a function block can be implemented by a processor and a software program executed by the processor. In other words, each function block described herein may be implemented in hardware, software, or any combination of hardware and software.

As described above, the present disclosure can improve interference immunity. Therefore, the present invention is useful for RF receivers, radio receivers, etc.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A radio frequency (RF) receiver, comprising:
  a local oscillator configured to generate a local oscillator signal;
  a mixer configured to multiply a received RF signal by the local oscillator signal, thereby to downconvert the received RF signal to a downconverted signal;
  a control unit configured to determine whether an interfering signal is received or not, from the downconverted signal,
  a variable gain amplifier configured to amplify the received RF signal based on a gain control signal, and to output an amplified signal; and
  a peak detector configured to determine a peak value of the amplified signal,
  wherein:
  the control unit changes a phase noise characteristic of the local oscillator based on a determination result of whether an interfering signal is received or not,
  if the control unit determines that an interfering signal other than an adjacent channel interfering signal is received, the control unit generates the gain control signal which specifies a gain so that a range of the peak value is a first range,
  if the control unit determines that no interfering signals other than the adjacent channel interfering signal e received, the control unit generates the gain control signal which specifies the gain so that the range of the peak value is a second range, and
  an upper bound of the second range is lower than an upper bound of the first range, and a lower bound of the second range is lower than a lower bound of the first range.

2. The RF receiver of claim 1, further comprising:
  a low-pass filter configured to smooth the downconverted signal, and to output a smoothed signal; and a subtractor configured to determine a difference between a power of the downconverted signal and a power of the smoothed signal, wherein the control unit determines whether the interfering signal is received or not based on the difference.

3. The RF receiver of claim 1, wherein the local oscillator includes a phase-locked loop having a loop filter, and the loop filter changes a characteristic thereof, thereby changes the phase noise characteristic of the local oscillator.

4. The RF receiver of claim 1, wherein the local oscillator includes a phase-locked loop having a phase comparator, and the phase comparator changes an output impedance thereof, thereby changes the phase noise characteristic of the local oscillator.

5. A radio receiver, comprising:

the RF receiver of claim 1; and a demodulator unit configured to demodulate the downconverted signal.

* * * * *